(12) United States Patent
Kao

(10) Patent No.: US 7,728,365 B2
(45) Date of Patent: Jun. 1, 2010

(54) CMOS IMAGE SENSOR STRUCTURE

(75) Inventor: Ching-Hung Kao, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/041,672

(22) Filed: Mar. 4, 2008

(65) Prior Publication Data

US 2008/0142858 A1      Jun. 19, 2008

Related U.S. Application Data

(62) Division of application No. 11/470,631, filed on Sep. 7, 2006.

(51) Int. Cl.
*H01L 31/062* (2006.01)

(52) U.S. Cl. .................. 257/290; 257/291; 257/292; 257/E27.13

(58) Field of Classification Search ......... 257/232–234, 257/290–294, E27.13; 438/57, 60, 70–75, 438/144–145
See application file for complete search history.

(56) References Cited

U.S. PATENT DOCUMENTS

| 7,338,832 | B2 * | 3/2008 | Park et al. | 438/57 |
| 7,344,910 | B2 * | 3/2008 | Rhodes | 438/57 |
| 2004/0188727 | A1 * | 9/2004 | Patrick | 257/292 |
| 2005/0179071 | A1 * | 8/2005 | Mouli | 257/291 |
| 2006/0255381 | A1 * | 11/2006 | McKee | 257/292 |
| 2007/0012962 | A1 * | 1/2007 | Rhodes | 257/290 |

\* cited by examiner

*Primary Examiner*—Ha Tran T Nguyen
*Assistant Examiner*—Daniel Whalen
(74) *Attorney, Agent, or Firm*—Jianq Chyun IP Office

(57) ABSTRACT

A CMOS image sensor (CIS) process is described. A semiconductor substrate is provided, and then a gate dielectric layer, a gate material layer and a thickening layer are sequentially formed on the substrate, wherein the thickening layer includes at least a hard mask layer. The thickening layer is defined to form a transfer-gate pattern, and then the transfer-gate pattern is used as an etching mask to pattern the gate material layer and form a transfer gate. Ion implantation is then conducted to form a PN diode in the substrate with the transfer-gate pattern and the transfer gate as a mask.

13 Claims, 3 Drawing Sheets

CMOS IMAGE SENSOR STRUCTURE

CROSS-REFERENCE TO RELATED APPLICATION

This application is a divisional of an application Ser. No. 11/470,631, filed on Sep. 7, 2006, now pending. The entirety of each of the above-mentioned patent applications is hereby incorporated by reference herein and made a part of this specification.

BACKGROUND OF THE INVENTION

1. Field of Invention

The present invention relates to fabrication and structures of a semiconductor device, and more particularly to a complementary metal-oxide-semiconductor (CMOS) image sensor (CIS) process and a CIS structure.

2. Description of Related Art

The CMOS image sensor is utilized more and more widely in image recording as compared with the charge-coupled device (CCD), for its fabricating process can be easily integrated with a conventional CMOS process lowering the manufacturing cost.

A typical CMOS image sensor includes a PN diode for absorbing incident light to produce charges, and a transfer transistor for transferring the charges. Referring to FIG. 3, in a conventional CIS process, the gate 302 of the transfer transistor is formed on a substrate 300, and a photoresist pattern 304 is formed exposing an area of the substrate 300 predetermined for forming the diode, wherein a portion of the gate 302 is usually exposed to make sure that the area is entirely exposed. Ion implantation 306 is then performed to form the doped region 308 of the diode, wherein the implantation depth is much larger than that in ordinary S/D implantation to reduce the dark current.

However, since the implantation depth is usually larger than the thickness of the gate 302 and a portion of the gate 302 is exposed in the implantation, a shallower doped region 309 is also formed under the gate 302 beside the doped region 308. Thus, the dark current under the gate 302 cannot be decreased effectively.

SUMMARY OF THE INVENTION

In view of the foregoing, this invention provides a CIS process that can reduce the dark current effectively and thereby improve the contrast of the recorded image.

This invention also provides a CIS structure that can be fabricated through the CIS process of this invention.

The CIS process of this invention is described as follows. A semiconductor substrate is provided, and then a gate dielectric layer, a gate material layer and a thickening layer are sequentially formed on the substrate, wherein the thickening layer includes at least a hard mask layer. The thickening layer is defined to form a transfer-gate pattern, and then the transfer-gate pattern is used as an etching mask to pattern the gate material layer and form a transfer gate. Ion implantation is then done to form a PN diode in the substrate with the transfer-gate pattern and the transfer gate as a mask.

In an embodiment, after the transfer-gate pattern is formed, a photoresist pattern may be further formed over a portion of the gate material layer predetermined for a reset gate, and then the photoresist pattern and the transfer-gate pattern are used as an etching mask to pattern the gate material layer and form a transfer gate and a reset gate.

Moreover, the above thickening layer may be a hard mask layer or a composite layer including a hard mask layer. In an embodiment, the thickening layer includes a dielectric layer, a conductive layer and a hard mask layer from bottom to top, and is defined to form the transfer-gate pattern and an upper electrode of capacitor at the same time. A photoresist pattern is then formed over a portion of the gate material layer predetermined for a reset gate and another portion for the lower electrode of capacitor, and is used together with the transfer-gate pattern as an etching mask to pattern the gate material layer into a transfer gate, a reset gate and a lower electrode simultaneously.

The CIS structure of this invention includes a semiconductor substrate, a gate dielectric layer on the substrate, a transfer gate on the gate dielectric layer, a thickening layer at least on the gate, and a PN diode including a PN junction in the substrate beside the transfer gate. The depth of the PN junction is smaller than the total thickness of the transfer gate and the thickening layer.

In some embodiments, the above CIS structure further includes a reset gate on the gate dielectric layer, the reset gate being defined together with the transfer gate from the same gate material layer.

Moreover, the thickening layer may be a hard mask layer or a composite layer including a hard mask layer. In cases where the thickening layer is a composite layer, the CIS structure may also include a reset gate and a capacitor, wherein the thickening layer includes a dielectric layer and a conductive layer thereon and is also disposed on the lower electrode of capacitor to serve as the capacitor dielectric layer and the upper electrode of the capacitor. The reset gate and the lower electrode of the capacitor are defined together with the transfer gate from the same gate material layer.

Since a thickening layer is disposed on the transfer gate in the CIS process of this invention, the PN junction of the photodiode can be formed deeply in the substrate without forming a doped region under the transfer gate in the ion implantation. Hence, the dark current of the CMOS image sensor can be lowered effectively.

In order to make the aforementioned and other objects, features and advantages of the present invention comprehensible, a preferred embodiment accompanied with figures is described in detail below.

DESCRIPTION OF EMBODIMENTS

Two embodiments of this invention are described below in reference of FIGS. 1A-1C and 2A-2C, respectively. The two embodiments are provide to further explain the present invention, but are not intended to limit the scope of this invention.

First Embodiment

Figure 1A:
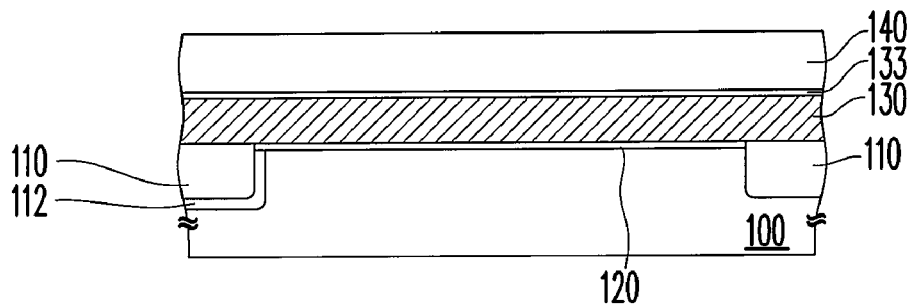
FIGS. 1A-1C illustrate, in a cross-sectional view, a CIS process according to a first embodiment of this invention.
Figure 1B:
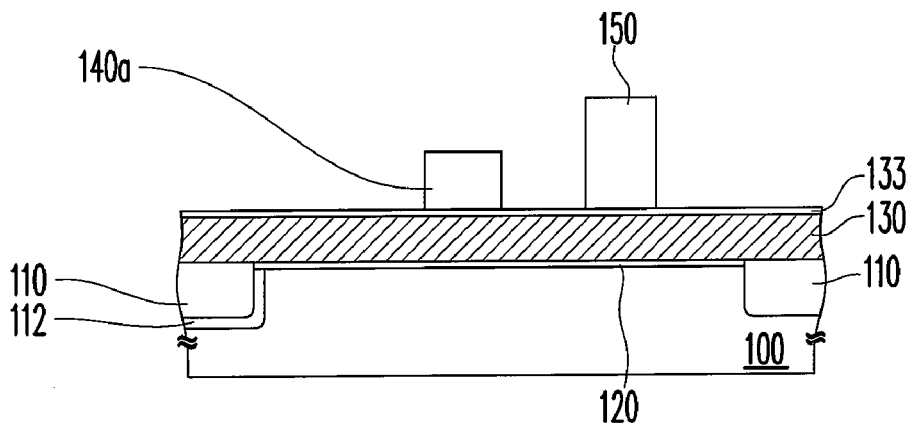
Figure 1C:
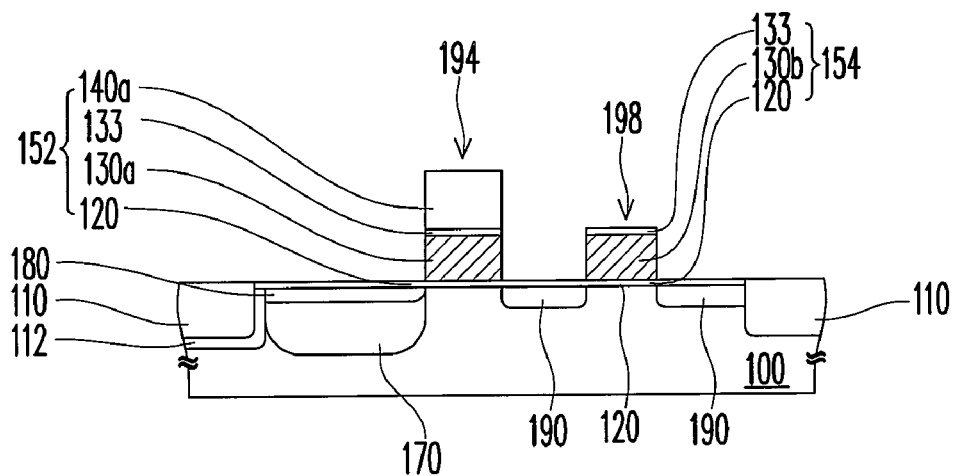

FIGS. 1A-1C illustrate, in a cross-sectional view, a CIS process according to the first embodiment of this invention, wherein the thickening layer is a hard mask layer.

Referring to FIG. 1A, a semiconductor substrate 100 like a p$^-$-doped single-crystal Si-substrate is provided, possibly formed with an isolation structure 110 therein. The isolation structure 110 may be a shallow trench isolation (STI) structure or a field oxide layer formed with local Si-oxidation, and a portion thereof may be formed with a doped region 112 around as field isolation, wherein the conductivity type of the doped region 112 is the same as that of the substrate 100. Then, a gate dielectric layer 120, a gate material layer 130 and a hard mask layer 140 as a thickening layer are formed on the substrate 100 in sequence. The gate dielectric layer 120 may include silicon oxide formed through thermal oxidation, the gate material layer 130 may include poly-Si, and the hard mask layer 140 may include silicon oxide, silicon nitride or silicon oxynitride (SiON). In a preferred embodiment, an etching stop layer 133 is formed on the gate material layer 130 before the hard mask layer 140 is formed for precisely controlling the etching of the hard mask layer 140. It is possible that the hard mask layer 140 includes one of silicon oxide and silicon nitride and the etching stop layer 133 includes the other one of silicon oxide and silicon nitride in consideration of the performance of stopping the etching to the hard mask layer 140.

Referring to FIG. 1B, the hard mask layer 140 is patterned into a transfer-gate pattern 140a. In cases where an etching stop layer 133 is formed under the hard mask layer 140, the etching recipe for patterning the hard mask layer 140 has a high etching selectivity to the material of the etching stop layer 133 so that the etching can be easily stopped thereon. Then, a photoresist pattern 150 is formed over a portion of the gate material layer 130 predetermined for forming a reset gate (130b in FIG. 1C), i.e., the gate of a reset transistor (198 in FIG. 1C).

Referring to FIG. 1C, the transfer-gate pattern 140a and the photoresist pattern 150 are used as an etching mask to pattern the gate material layer 130 into a transfer gate 130a and a reset gate 130b simultaneously, and then the photoresist pattern 150 is removed. The transfer-gate pattern 140a formed from the hard mask layer 140, the etching stop layer 133 (optional), the transfer gate 130a and the gate dielectric layer 120 under 130a together constitute a transfer gate structure 152. Meanwhile, the reset gate 130b, the etching stop layer 133 on the reset gate 130b and the gate dielectric layer 120 under 130b together constitute a reset gate structure 154. After the reset gate 130b is formed, the etching stop layer 133 on the reset gate 130b may be removed, or may be kept to serve as a cap layer for the underlying reset gate 130b.

Figure 3:
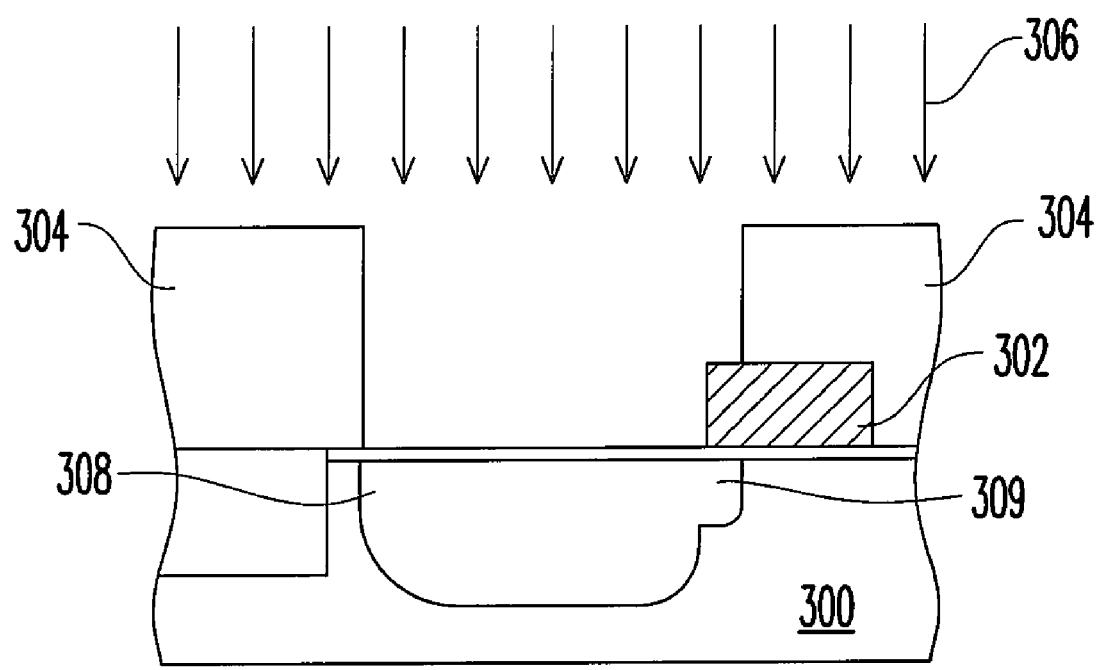
FIG. 3 illustrates a conventional CIS process in a cross-sectional view.

Then, a doped region 170, which is n-doped when the substrate 100 is of p-type, is formed in the substrate 100 through ion implantation using the transfer gate structure 152 as a mask, so as to form a PN diode with the substrate 100. A p-doped region 180 is optionally formed in the substrate 100 over and apart from the PN junction of the n-doped region 170 with the transfer gate structure 152 as a mask, possibly before or after the n-doped region 170 is formed, so as to improve the sensitivity of the CIS. The one implantation step for forming the doped region 170 or the two implantation steps for forming the doped regions 170 and 180 also require a patterned photoresist layer as shown in FIG. 3 (see 304) to serve as an implantation mask, while the patterned photoresist layer is omitted in FIG. 1C for simplicity. In addition, heavily doped S/D regions 190 having the same conductivity type of the doped region 170 are formed in the substrate 100 using the reset gate structure 154 and the transfer gate structure 152 as a mask, while the patterned photoresist layer covering the other portions of the substrate 100 is also omitted in FIG. 1C for simplicity. It is also noted that the S/D regions 190 may be formed before or after the doped region 170 is formed. The transfer gate structure 152 and one S/D region 190 together constitute a transfer transistor 194, while the reset gate structure 154 and the two S/D regions 190 together form a reset transistor 198. The transfer transistor 194 and the reset transistor 198 share one S/D region 190.

Since a transfer-gate pattern 140a as a thickening layer is formed on the transfer gate 130a in the CIS process according to the above embodiment, the PN junction of the photodiode between the substrate 100 and the dope region 170 can be formed deeply without forming a doped region under the transfer gate 130a as in FIG. 3. Hence, the dark current of the CMOS image sensor can be lowered effectively.

Moreover, after the photodiode including the doped region 170 is formed, the transfer-gate pattern 140a may be kept or be removed. In cases where the transfer-gate pattern 140a is removed, the etching stop layer 133 on the transfer gate 130a and the reset gate 130b may be kept or be removed after 140a is removed.

Second Embodiment

Figure 2A:
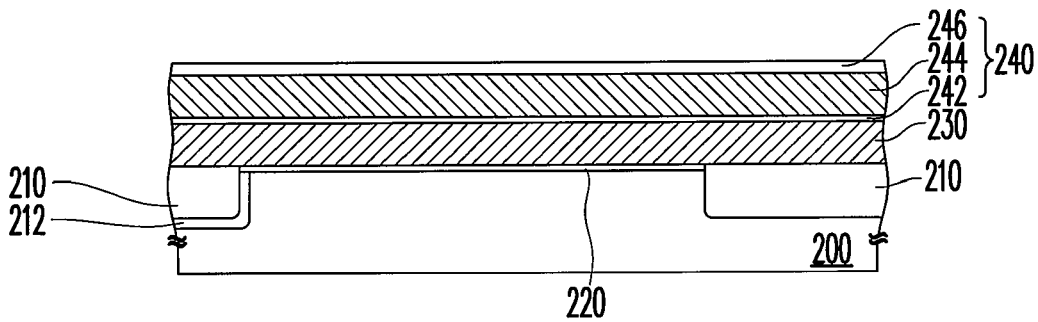
FIGS. 2A-2C illustrate, in a cross-sectional view, a CIS process according to a second embodiment of this invention.
Figure 2B:
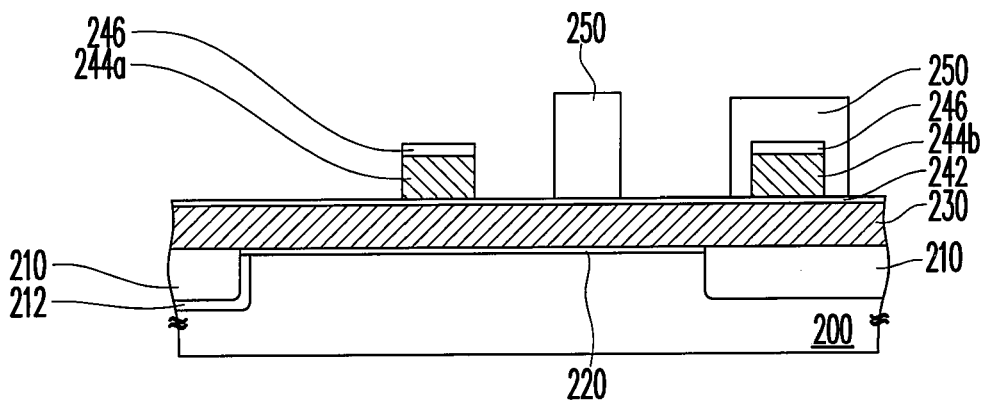
Figure 2C:
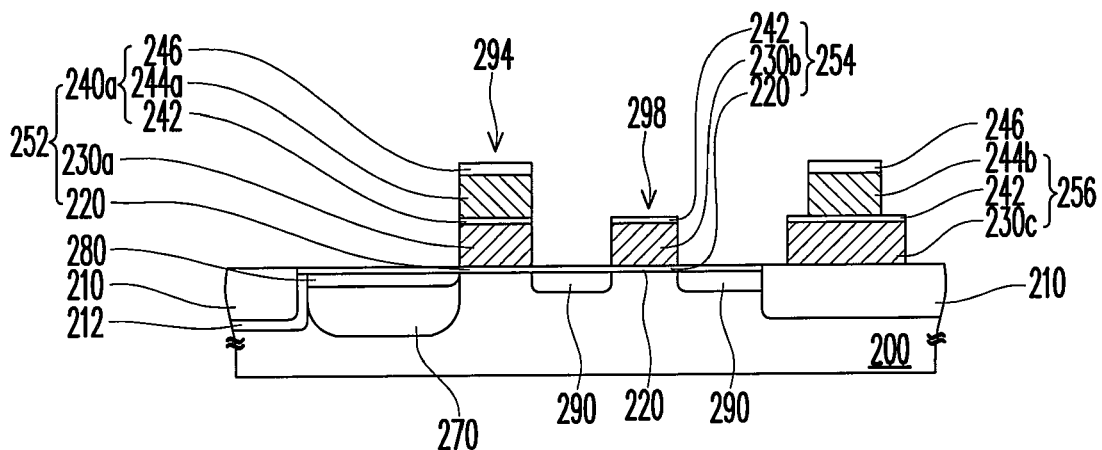

FIGS. 2A-2C illustrate, in a cross-sectional view, a CIS process according to the second embodiment of this invention, wherein the thickening layer is a composite layer including a dielectric layer, a conductive layer and a hard mask layer from bottom to top, and a capacitor is fabricated simultaneously with the gate structures.

Referring to FIG. 2A, a semiconductor substrate 200 formed with an isolation structure 210 therein is provided, wherein the isolation structure 210 may be the same as the above isolation structure 110, and a portion thereof may be formed with a doped region 212 around as field isolation like the above doped region 112. A gate dielectric layer 220, a gate material layer 230 and a thickening layer 240 are sequentially formed on the substrate 200, wherein the thickening layer 240 includes a dielectric layer 242, a conductive layer 244 and a hard mask layer 246 in the sequence of their formations. The materials of the gate dielectric layer 220 and the gate material layer 230 may be the same as those of the above gate dielectric layer 120 and the above gate material layer 130. The dielectric layer 242 includes a material that suitably serves as a capacitor dielectric material, such as silicon oxide, silicon nitride or a high-k material. The conductive layer 244 may include poly-Si, and the hard mask layer 246 may include silicon oxide, silicon nitride or SiON.

Referring to FIG. 2B, the hard mask layer 246 and the conductive layer 244 are patterned to form a transfer-gate pattern 244a and an upper electrode 244b of a capacitor, while the dielectric layer 242 may serve as an etching stop layer. The upper electrode 244b and the lower electrode formed later are generally disposed over the isolation structure 210. Then, a photoresist pattern 250 is formed covering a portion of the gate material layer 230 predetermined for forming a reset gate (230b in FIG. 2C) as well as another portion of the same predetermined for forming a lower electrode (230c in FIG. 2C) of the capacitor.

Referring to FIG. 2C, the transfer-gate pattern 244a with the hard mask layer 246 thereon and the photoresist pattern 250 are used as an etching mask to pattern the gate material layer 230 into a transfer gate 230a, a reset gate 230b and a lower electrode 230c simultaneously, and then the photoresist pattern 250 is removed. The transfer-gate pattern 244a, the dielectric layer 242 under 244a and the hard mask layer on 244a together constitute a patterned thickening layer 240a on the transfer gate 230a, and the patterned thickening layer 240a, the transfer gate 230a and the gate dielectric layer 220 under the transfer gate 230a together constitute a transfer gate structure 252. The reset gate 230b, the dielectric layer 242 on 230b and the gate dielectric layer 220 under 230b together constitute a reset gate structure 254. In addition, the lower electrode 230c, the upper electrode 244b and the dielectric layer 242 between them together constitute a capacitor 256.

After the reset gate 230b is formed, the dielectric layer 242 on the reset gate 230b may be removed, or may be kept to serve as a cap layer.

Then, a doped region 270, which is n-doped when the substrate 200 is of p-type, is formed in the substrate 200 through ion implantation using the transfer gate structure 252 as a mask, so as to form a PN diode with the substrate 200. A p-doped region 280 is optionally formed in the substrate 200 over and apart from the PN junction of the n-doped region 270 with the transfer gate structure 252 as a mask, possibly before or after the n-doped region 170 is formed, so as to improve the sensitivity of the CIS. The patterned photoresist layer required for the ion implantation as shown in FIG. 3 is omitted in FIG. 2C for simplicity, as in the case of the first embodiment. In addition, heavily doped S/D regions 290 having the same conductivity type of the doped region 270 are formed in the substrate 200 using the reset gate structure 254 and the transfer gate structure 252 as a mask, while the patterned photoresist layer covering the other portions of the substrate 200 is also omitted in FIG. 2C for simplicity. It is also noted that the S/D regions 290 may be formed before or after the doped region 270 is formed. The transfer gate structure 252 and one S/D region 290 together constitute a transfer transistor 294, and the reset gate structure 254 and the two S/D regions 290 together constitute a reset transistor 298. The transfer transistor 294 and the reset transistor 298 thus share one S/D region 290.

Since a patterned thickening layer 240a is disposed on the transfer gate 230a in the CIS process according to the above embodiment, the PN junction of the photodiode between the substrate 200 and the dope region 270 can be formed deeply without forming a doped region under the transfer gate 230a as in FIG. 3. Hence, the dark current of the CMOS image sensor can be lowered effectively.

Moreover, after the photodiode including the doped region 270 is formed, the hard mask layer 246 may be kept or be removed. That is, the thickening layer 240a on the transfer gate 230a may include a dielectric layer 242 and a transfer-gate pattern 244a only, and may further include a hard mask layer on the transfer-gate pattern 244a.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. A CMOS image sensor (CIS) structure, comprising:
   semiconductor substrate;
   gate dielectric layer on the substrate;
   transfer gate on the gate dielectric layer;
   a thickening layer disposed at least on the transfer gate and comprising a hard mask layer, wherein all sidewalls of the hard mask layer are coplanar with corresponding sidewalls of the transfer gate;
   PN diode including a PN junction in the substrate beside the transfer gate; and
   reset gate on the gate dielectric layer, the reset gate being defined together with the transfer gate from a gate material layer, wherein
   there is no thickening layer on the reset gate.

2. The CIS structure of claim 1, wherein the hard mask layer comprises silicon oxide, silicon nitride or SiON.

3. The CIS structure of claim 1, further comprising an etching stop layer between the transfer gate and the hard mask layer.

4. The CIS structure of claim 3, wherein the etching stop layer comprises one of silicon oxide and silicon nitride and the hard mask layer comprises the other one of silicon oxide and silicon nitride.

5. The CIS structure of claim 3, wherein the etching stop layer is also disposed on the reset gate.

6. The CIS structure of claim 1, wherein the diode comprises an n-doped region that forms the PN junction with the substrate, further comprising a p-doped region in the substrate over and apart from the PN junction.

7. A CMOS image sensor (CIS) structure, comprising:
   a semiconductor substrate;
   a gate dielectric layer on the substrate;
   a transfer gate on the gate dielectric layer;
   a thickening layer disposed at least on the transfer gate, wherein all sidewalls of the thickening layer are coplanar with corresponding sidewalls of the transfer gate;
   a PN diode including a PN junction in the substrate beside the transfer gate; and
   a reset gate on the gate dielectric layer, the reset gate being defined together with the transfer gate from a gate material layer, wherein
   there is no thickening layer on the reset gate.

8. The CIS structure of claim 7, wherein the thickening layer comprises a hard mask layer.

9. The CIS structure of claim 8, wherein the hard mask layer comprises silicon oxide, silicon nitride or SiON.

10. The CIS structure of claim 8, further comprising an etching stop layer between the transfer gate and the hard mask layer.

11. The CIS structure of claim 10, wherein the etching stop layer comprises one of silicon oxide and silicon nitride and the hard mask layer comprises the other one of silicon oxide and silicon nitride.

12. The CIS structure of claim 10, wherein the etching stop layer is also disposed on the reset gate.

13. The CIS structure of claim 7, wherein the diode comprises an n-doped region that forms the PN junction with the substrate, further comprising a p-doped region in the substrate over and apart from the PN junction.

* * * * *